United States Patent [19]

Kumagai

[11] Patent Number: 4,615,030
[45] Date of Patent: Sep. 30, 1986

[54] SEMICONDUCTOR MEMORY DEVICE WITH SELF CORRECTION CIRCUIT

[75] Inventor: Yutaka Kumagai, Tokyo, Japan

[73] Assignee: OKI Electric Industry Co. Ltd., Tokyo, Japan

[21] Appl. No.: 596,281

[22] Filed: Apr. 3, 1984

[30] Foreign Application Priority Data

Apr. 4, 1983 [JP] Japan ................... 58-58023

[51] Int. Cl.⁴ ................... G06F 11/00; G11C 29/00
[52] U.S. Cl. ................... 371/71; 371/21
[58] Field of Search ................... 371/71, 21, 24, 13; 324/73 R, 73 AT; 365/200, 201

[56] References Cited

U.S. PATENT DOCUMENTS

| | | | |
|---|---|---|---|
| 3,096,511 | 7/1963 | Taras | 371/71 X |
| 3,768,071 | 10/1973 | Knauft et al. | 371/71 X |
| 3,940,601 | 2/1976 | Henry et al. | 371/71 X |
| 4,045,779 | 8/1977 | Markle | 371/71 |
| 4,228,528 | 10/1980 | Cenker et al. | 365/200 |
| 4,363,125 | 12/1982 | Brewer et al. | 371/71 |
| 4,365,332 | 12/1982 | Rice | 371/13 |

OTHER PUBLICATIONS

Quinn et al., Dynamic Testing of Memory Arrays Which Utilize ECC Logic, Electronic Engineering, vol. 53, No. 650, Mar. 1981, pp. 33-36, 38, 40-43.
Williams, High-Speed, Low-Volume Data Array Self-Test, IBM Technical Disclosure Bulletin, vol. 23, No. 8, Jan. 1981, pp. 3596-3597.

Primary Examiner—Charles E. Atkinson
Attorney, Agent, or Firm—Martin Novack

[57] ABSTRACT

A semiconductor memory chip (FIG. 2) with a memory array (3) is backed-up by a self diagnosis circuit (15, 16, 17, 18, 19) so that an error of a single defective cell, or a single defective row of cells, or a single defective column of cells is automatically corrected. The backup circuit comprises a self diagnosis circuit (15) which has a one-bit memory for storing information in write phase before it is stored in a cell of the memory array (3), and comparison means for comparing the content of said one-bit memory with information immediately read out of the same cell in said write phase, a register means (16, 17) for storing the address of the memory array when said self diagnosis circuit (15) provides an error signal (P) according to the result of the comparison, and an inverter circuit (19) for inverting the output of the addressed memory cell when selected address in read phase coincides with the content of said register means (16,17). Thus, an error of a cell of the memory array is automatically corrected. Said self diagnosis circuit is mounted on the same semiconductor chip as that of a memory array itself.

6 Claims, 13 Drawing Figures

SEMICONDUCTOR MEMORY DEVICE WITH SELF CORRECTION CIRCUIT

BACKGROUND OF THE INVENTION

The present invention relates to a semiconductor memory device and, in particular, relates to such a memory which has a self diagnosis circuit in a semiconductor chip.

A large capacity semiconductor memory device, for instance, 256 kbit static memory, and 1 Mbit dynamic memory, has recently been developed and reflects the development of a semiconductor producing process. However, due to the complicated structure and the large scale of a memory array in a semiconductor memory device, it has been difficult to manufacture a semiconductor memory device which has no defective cells.

If a complete semiconductor memory device which has no defective cells is required, the yield rate of the semiconductor memory chip decreases considerably, and therefore, the manufacturing cost would increase.

Accordingly, if a defective cell of a semiconductor memory is recovered by circuit means, the yield rate of a large semiconductor memory chip is considerably increased.

Conventionally, a memory chip which has a normal memory array together with a redundant memory cell has been proposed. In that case, when there is a defective cell in a memory array, that defective cell is replaced by a redundant memory cell.

Figures 1, 1A:
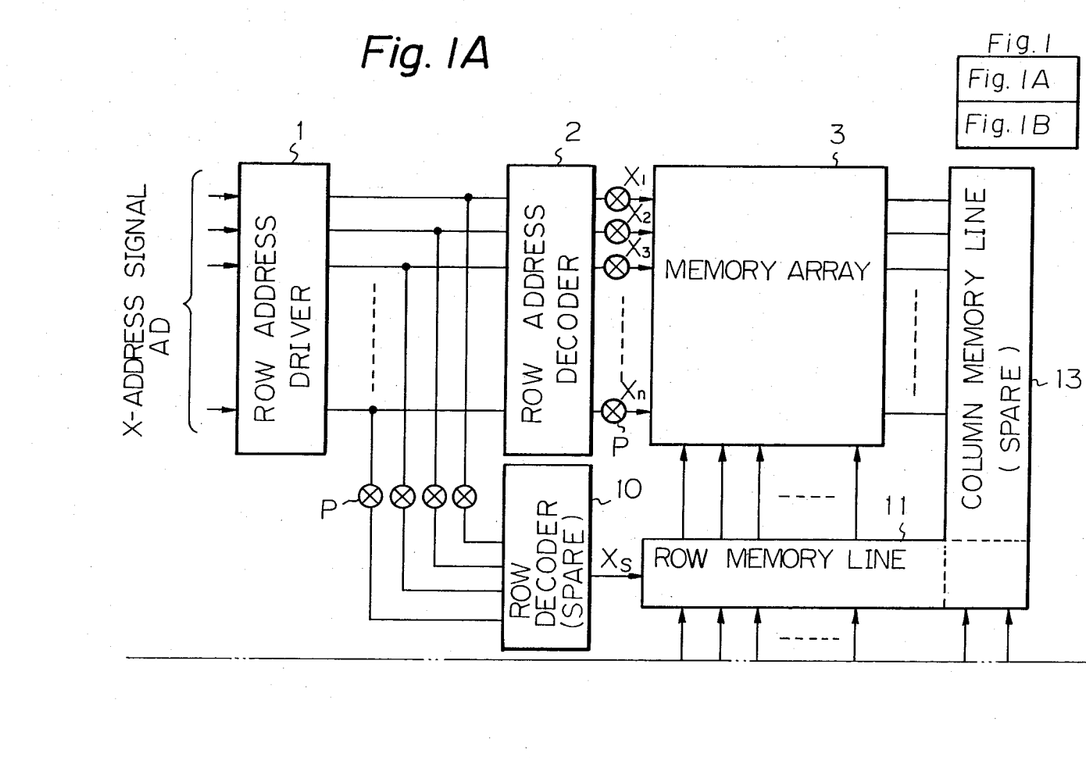
Figure 1B:
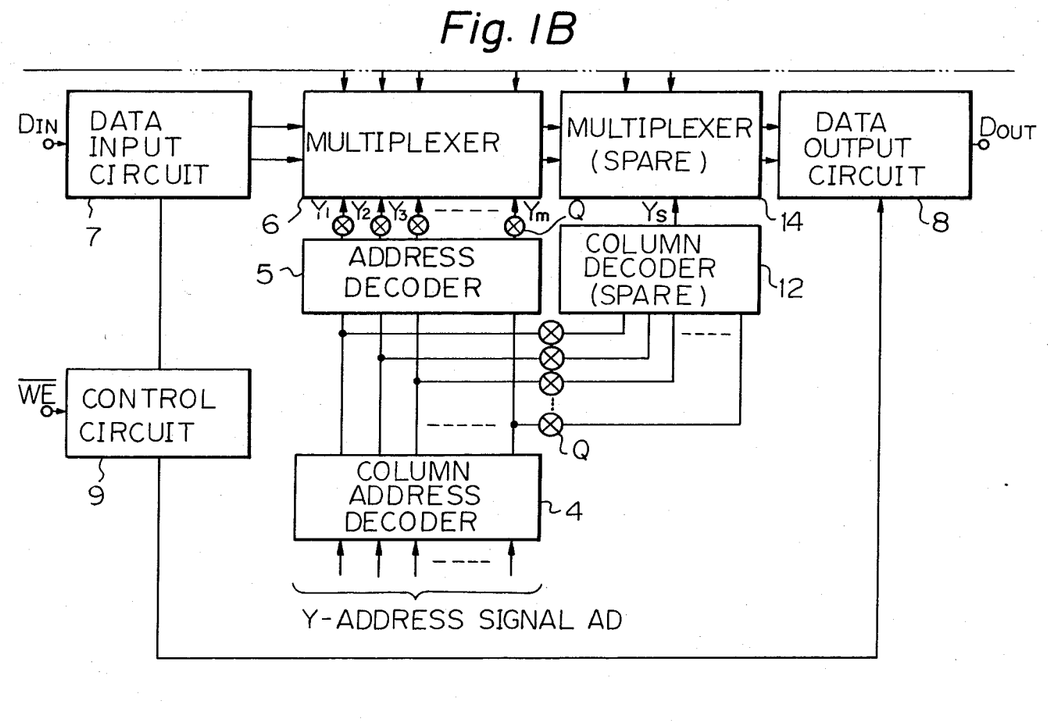

FIG. 1 is a block diagram of a prior static memory device with a redundant cell. In the figure, the reference numeral 1 is a row address driver, 2 is a row address decoder, 3 is a memory array, 4 is a column address driver, 5 is a column address decoder, 6 is a multiplexer, 7 is a data input circuit, 8 is a data output circuit, 9 is a write enable circuit. The memory device of FIG. 1 has a redundant means for the backup of a defective cell, and said redundant means has a spare row address decoder 10, a spare row memory line 11, a spare column address decoder 12, a spare column memory line 13, a spare multiplexer 14, a wiring means P of polysilicon or nichrome wire for coupling a spare row decoder 10 and word lines, and another wire means Q of polysilicon or nichrome for coupling a spare column decoder with bit lines.

When a memory cell coupled with one of word lines (for instance, word line $X_2$) is defective, a wire means P is selectively cut by a laser beam. Then, when the defective memory cell is selected by the row address driver 1, the defective word line $X_2$ is switched to the spare row memory line $X_s$.

Similarly, when a memory cell coupled with the bit line $Y_2$ of the memory array 3 is defective, the wiring means Q is selectively cut by a laser beam. Then, when the defective cell is selected by the column address driver, that bit line is automatically switched to the spare column memory line $Y_s$.

Thus, the semiconductor device of FIG. 1 replaces a defective portion to a spare portion, and therefore, the yield rate of a semiconductor chip is substantially improved.

However, the device of FIG. 1 has the disadvantages that the particular laser trimming device for cutting a polysilicon wire, or the particular current source for cutting a nichrome wire is necessary, and that the steps for switching to a spare means is complicated. Further, when a polysilicon wire or a nichrome wire is cut, a surface of a memory chip is polluted by spatters, and therefore, the operational reliability of a memory chip is decreased.

SUMMARY OF THE INVENTION

It is an object, therefore, of the present invention to overcome the disadvantages and limitations of a prior memory chip by providing a new and improved memory chip.

It is also an object of the present invention to provide a semiconductor memory chip which can diagnose and/or recover a defective cell.

It is also an object of the present invention to provide a semiconductor memory chip which can use a defective cell without providing a spare row memory line and a spare column memory line.

The above and other objects are attained by a semiconductor memory device comprising a memory array having a plurality of memory cells arranged in matrix, a data line coupled with said memory array through switching means which is provided for each column of the matrix of said memory array for writing and reading information to and from said memory array, a data input circuit coupled with said data line for writing information in a selected memory cell in said memory array, a data output circuit coupled with said data line to read out information from a selected memory cell in said memory array to provide output information to an output terminal ($D_{out}$), a self diagnosis circuit (15) coupled with said data line for reading information from a memory cell just after said information is written in said memory cell to compare read out information with write information before writing in order to determine if the writing operation to a selected cell is accomplished correctly, a register circuit (16, 17) coupled with each row and each column of said memory array for storing a selected address for said memory array according to an output signal (P) of said self diagnosis circuit (15), a logic circuit (18) coupled with said register circuit (16, 17) for determining if a selected address of a memory array coincides with the content of said register circuit (16, 17), an output inverter circuit (19) provided between said data output circuit and said output terminal for inverting information of said data output circuit according to an output signal (P) of said logic circuit (18).

BRIEF DESCRIPTION OF THE DRAWINGS

The above and other objects, features, and attendant advantages of the present invention will be appreciated as the same become better understood by means of the following description and accompanying drawings wherein;

FIG. 1, which comprises FIG. 1A and FIG. 1B, is a block diagram of a prior semiconductor static memory device, FIG. 2, which comprises FIG. 2A, FIG. 2B, FIG. 2C and FIG. 2D, is a block diagram of the semiconductor static memory device having a self diagnosis circuit and/or a self recovery circuit according to the present invention, FIG. 3, which comprises

DESCRIPTION OF THE PREFERRED EMBODIMENTS

Figures 2, 2A:
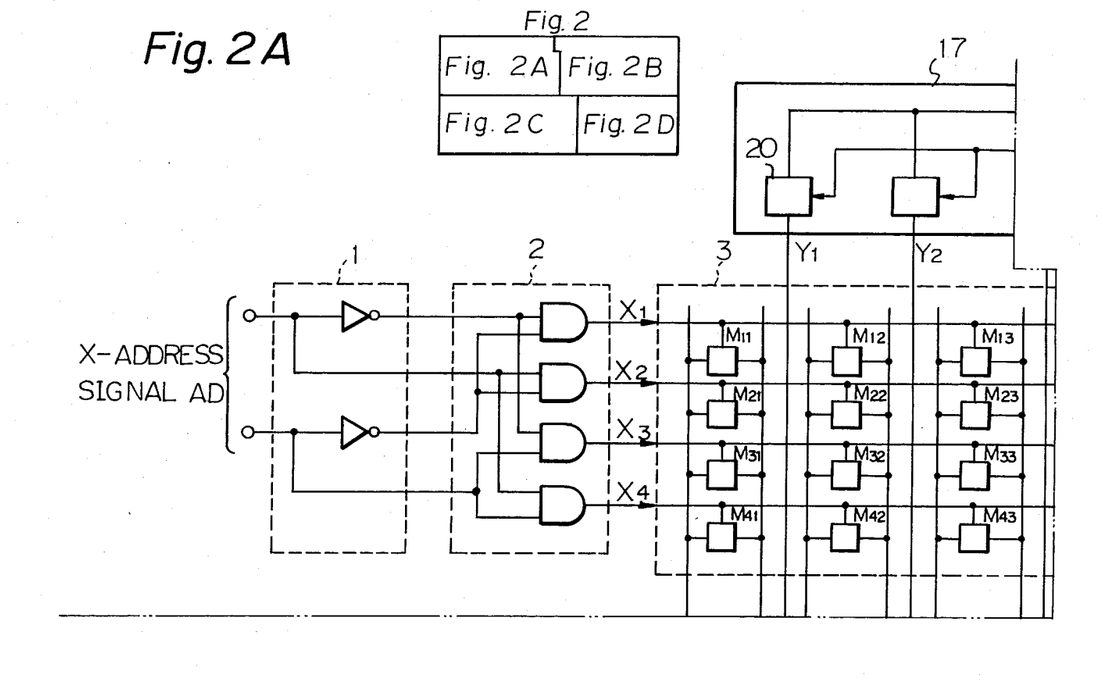
Figure 2B:
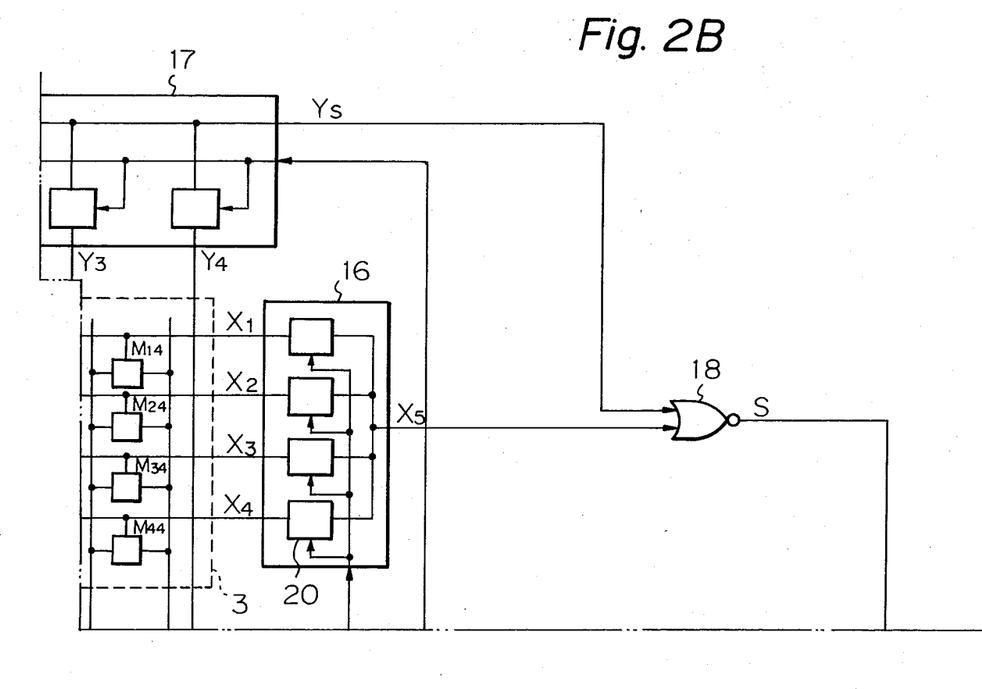
Figure 2C:
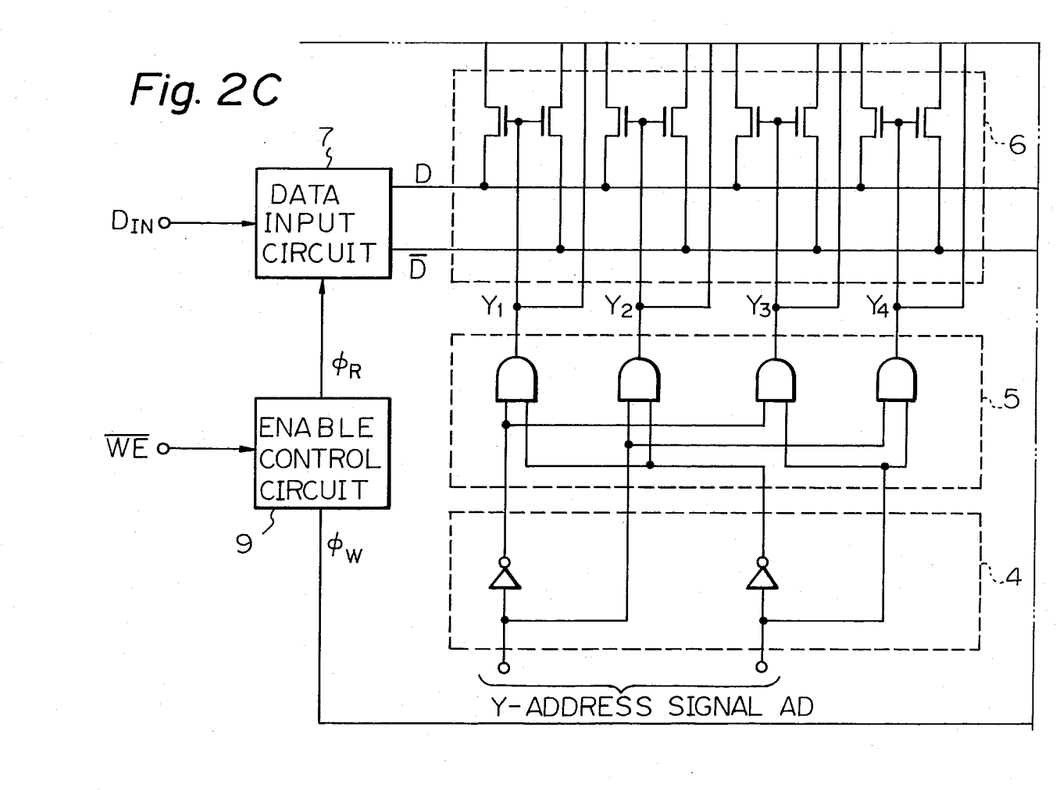
Figure 2D:
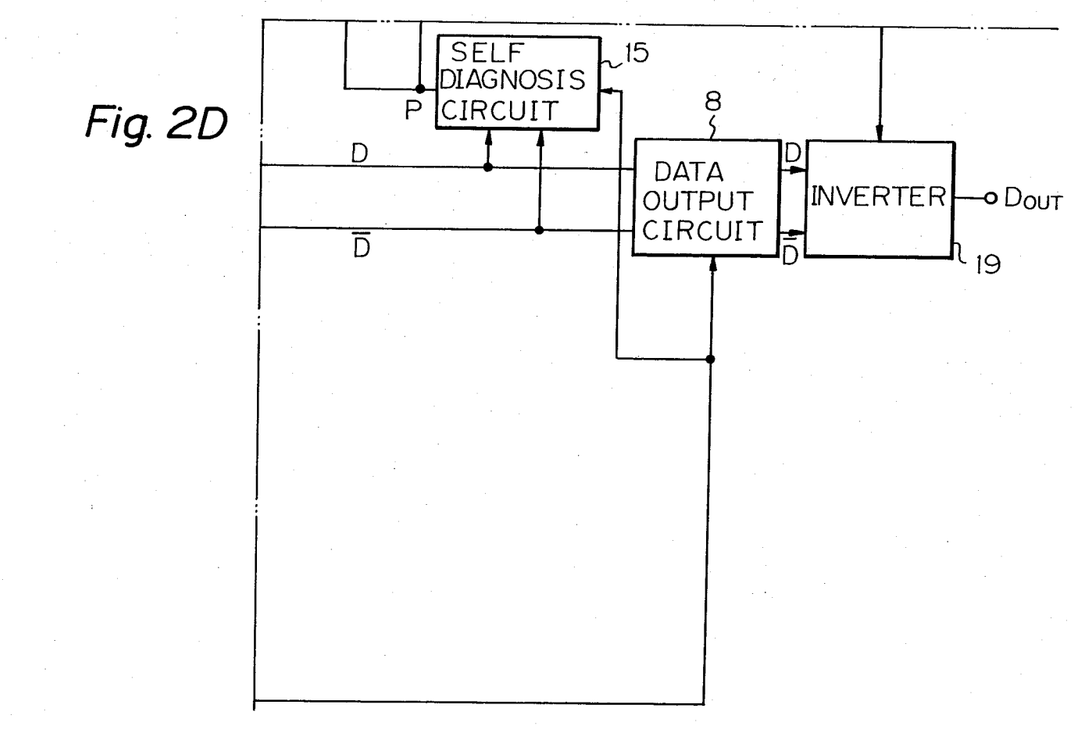

FIG. 2 shows a block diagram of the static semiconductor memory device according to the present invention.

The present memory device has the row address driver 1 for providing an internal address signal by an external row address input signal AD, a row address decoder 2 for selecting one row of the word lines $X_1$ through $x_4$ by said internal address signal, a memory array 3 having n number of word lines and m number of bit lines (FIG. 2 shows only 4 word lines $X_1$-$X_4$ and 4 bit lines $Y_1$-$Y_4$), a column address driver 4 for providing an internal column address signal by an external column address input signal, a column address decoder 5 for providing one of bit lines $Y_1$ through $Y_4$ by said internal column address signal, and a multiplexer 6 for coupling the selected memory cell with the data lines D and $\overline{D}$ according to the output signal of said column address decoder 5.

The present memory device has further an enable control circuit 9 for providing a write control signal $\phi_W$ and a read control signal $\phi_R$ according to a write enable signal $\overline{WE}$, a data input circuit 7 for applying a data input signal $D_{in}$ to the data lines D and $\overline{D}$ selectively according to said read control signal $\phi_R$, a data output circuit 8 for applying memory cell information on the data lines D and $\overline{D}$ to a data output terminal $D_{out}$ according to said write control signal $\phi_W$.

The row address driver 1 and the column address driver 4 are composed of a plurality of inverters. The row address decoder 2 and the column address decoder 5 are composed of a plurality of AND circuits (or NOR circuits). The memory array 3 has a plurality of memory cells, and it is assumed that the memory cell $M_{33}$ is defective in the present explanation. The multiplexer 6 has a plurality of MOS transistors which are coupled with the bit lines.

The present memory device has further a self diagnosis circuit 15, a row register 16, a column register 17, a NOR circuit 18 and an output inverter circuit 19.

The self diagnosis circuit 15 stores the information on the data lines D and $\overline{D}$ which is to be stored in a selected memory cell. That information is provided by the data input circuit 7. Then, the signal stored in the memory cell is immediately read out by the write control signal $\phi_W$, and the read out signal is provided to the data lines D and $\overline{D}$. Then, the self diagnosis circuit 15 compares the data on the data lines D and $\overline{D}$ which is read out of the memory cell with the data stored in the self diagnosis circuit 15 itself which is the original signal to be stored. When those two data do not coincide with each other, the self diagnosis circuit 15 provides an error signal P.

The row register 16 and the column register 17 receive the row line signal and the column line signal (H level) of the selected memory cell according to the error signal P of the self diagnosis circuit 15, in a write cycle. The row register 16 provides a concidence signal when the row line level of the selected memory cell coincides with the stored row signal level. Simultaneously, the column register 16 provides a coincidence signal when the column line level of the selected memory cell coincides with the stored column signal level, in a read cycle.

A logic circuit 18 which is composed of a NOR circuit provides a control signal S when both the row register 16 and the column register 17 provide coincidence signals.

The output inverter circuit 19 inverts the output signal of the data output circuit 8 when the NOR circuit 18 provides a control signal S. The inverted signal is applied to the output terminal $D_{out}$.

Figure 4:
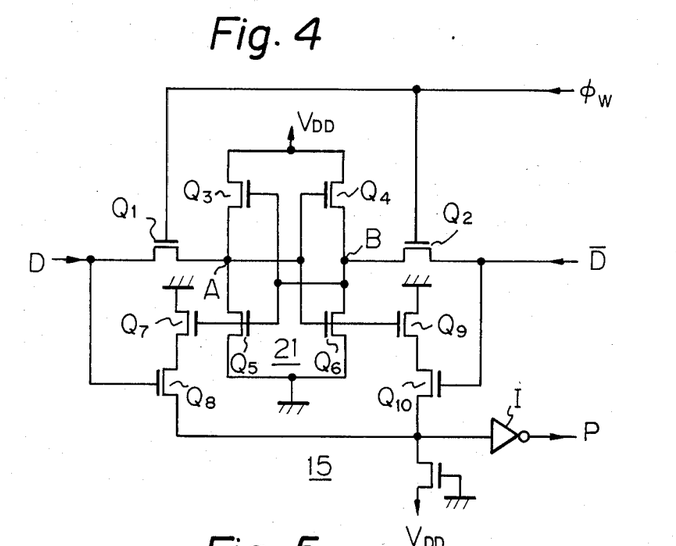
FIG. 4 is a detailed circuit diagram of a self diagnosis circuit in FIG. 2.

The self diagnosis circuit 15 is composed of an associate memory (as shown in FIG. 4, for instance), and has the memory circuit 21 with the MOS transistors $Q_3$, $Q_4$, $Q_5$, and $Q_6$, a pair of switching transistors $Q_1$ and $Q_2$ which apply signal on the data lines D and $\overline{D}$ to said memory circuit 21 by the write control signal $\phi_W$, a pair of MOS transistors $Q_7$ and $Q_8$ which are controlled by the potential at the node B and the data line D, and another pair of MOS transistors $Q_9$ and $Q_{10}$ which are controlled by the potential at the node A and the data line $\overline{D}$, and an inverter I.

Figure 5:
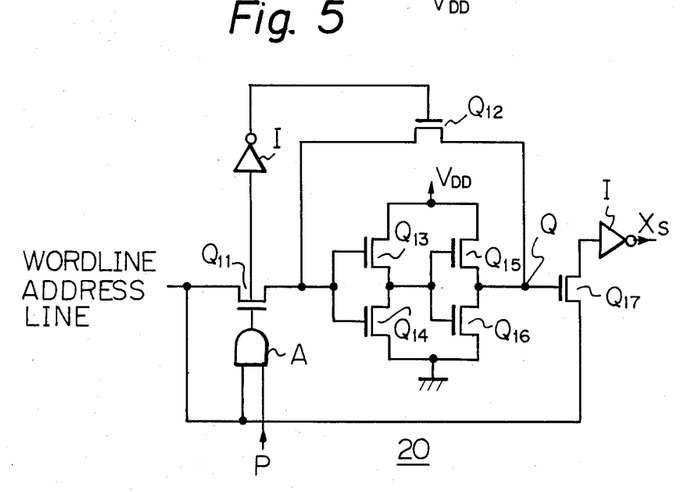
FIG. 5 is a detailed circuit diagram of a temporary memory circuit in FIG. 2.

The row register 16 and the column register 17 are composed of a plurality of temporary memory circuits 20 as shown in FIG. 5. That temporary memory circuit 20 has MOS transistors $Q_{11}$ through $Q_{17}$, an inverter I, and an AND circuit A. Upon receiving an error signal P in a write phase, that temporary memory circuit 20 stores the information on the word line or the bit line, and sets the junction Q to a H level to conduct the MOS transistor $Q_{17}$. Therefore, when the same word line or bit line is selected in a read phase as that in said write phase, that temporary memory circuit 20 provides an inverted level on the selected word line or the selected bit line to the output line $X_s$ or $Y_s$.

Figure 6:
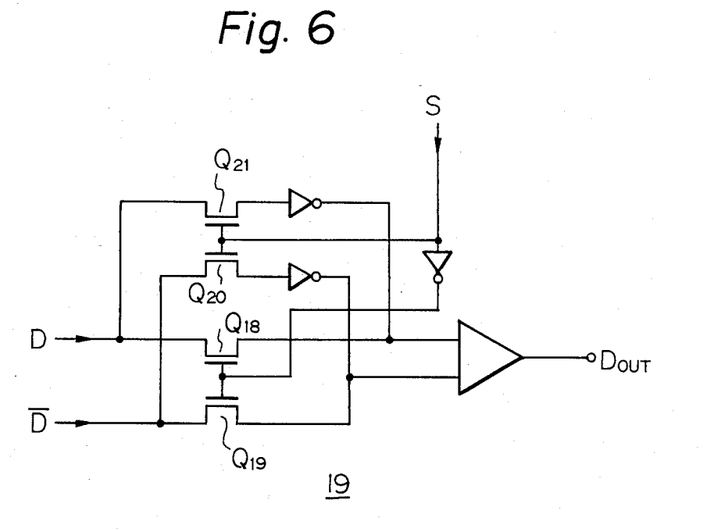
FIG. 6 is a detailed circuit diagram of an output inverter circuit in FIG. 2.

The output inverter circuit 19 is shown in FIG. 6, and has MOS transistors $Q_{18}$ through $Q_{21}$, an inverter I, and an amplifier M. When the output S of the NOR circuit 18 (see FIG. 2) is in the L (low) level, the MOS transistors $Q_{18}$ and $Q_{19}$ are conductive, and the output signal from a memory cell is applied to the output terminal $D_{out}$ as it is. On the other hand, when said output signal S of the NOR circuit 18 is in H (high) level, the MOS transistors $Q_{20}$ and $Q_{21}$ are conductive, and the output signal from a memory cell is inverted and then the reversed signal is applied to the output terminal $D_{out}$.

Figure 3A:
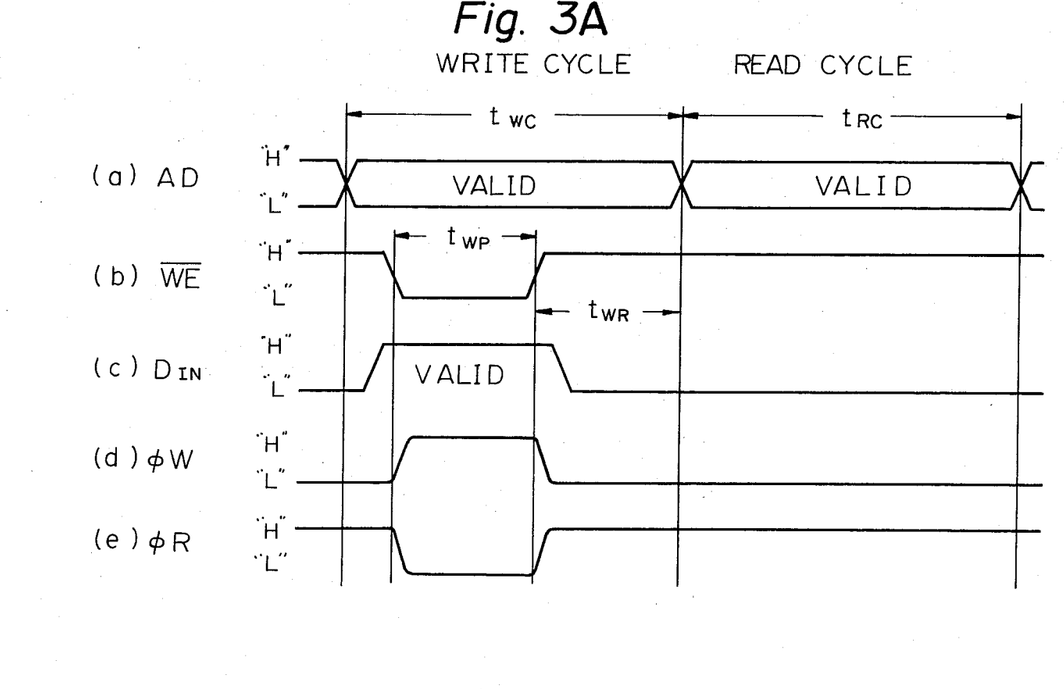
FIG. 3A and FIG. 3B, is an operational time chart showing the operation of the apparatus of FIG. 2.
Figure 3B:
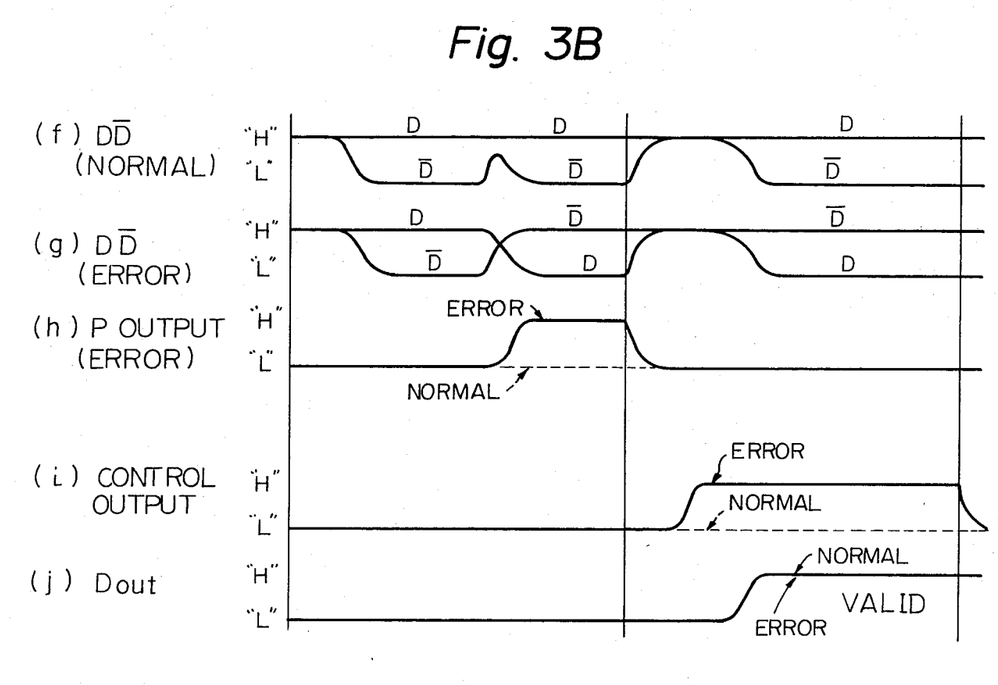

The operation of the present memory device is described in accordance with the operational timing sequence in FIG. 3.

In a write period $t_{wc}$, the word line $X_1$ and the bit line $Y_2$ are decoded by the row and the column address signals AD, and the normal memory cell $M_{12}$ is selected. At the initial stage of the write period $t_{wc}$, the write enable signal $\overline{WE}$ is at H level, and therefore, the control signal $\phi_W$ is at L level, and the control signal $\phi_R$ is at H level. And, the data output lines D and $\overline{D}$ of the data input circuit 7 are at H level. Accordingly, the data output circuit 8 is prohibited to provide an output signal, and the self diagnosis circuit 15 does not store the signal on the data lines D and $\overline{D}$.

Next, it is assumed that the write enable signal $\overline{WE}$ becomes to L level during the period $t_{wp}$. Then, the data input signal $D_{in}$ (which is supposed to be H level) is applied to the data input circuit 7, and the data lines D and $\overline{D}$ become to H and L level, respectively. Then, the signal on that data lines D and $\overline{D}$ is stored in the memory cell $M_{12}$ (see FIGS. 3(b), 3(c), 3(d), 3(e), 3(f)).

Simultaneously, the MOS transistors $Q_1$ and $Q_2$ in the self diagnostic circuit 15 are conducted, and therefore, the signal on the data lines D and $\overline{D}$ is stored in the memory circuit 21. In that case, the transistors $Q_7$ and $Q_8$ are in OFF and ON states, respectively, the transistors $Q_9$ and $Q_{10}$ are in ON and OFF states, respectively, and the control signal P is in L level.

Next, when the write enable signal $\overline{WE}$ goes to H level again in $t_{WR}$ period, the information just stored in the selected memory cell $M_{12}$ is read out. If the memory cell $M_{12}$ is normal, the data lines D and $\overline{D}$ go to H and L levels, respectively, the transistors $Q_7$ and $Q_8$ go to OFF and ON states, respectively, the transistors $Q_9$ and $Q_{10}$ go to ON and OFF states, respectively, and therefore, the control signal P holds L level.

Next, when the memory cell $M_{12}$ is selected in a read phase $t_{RC}$, both the output signal $X_s$ of the row register 16 and the output signal $Y_s$ of the column register 17 go to H levels, respectively. Since the NOR circuit 18 holds the output signal S to L level, the output inverter circuit 19 provides the signal on the data lines D and $\overline{D}$ to the data output terminal $D_{out}$ as it is.

Next, it is assumed that a defective memory cell $M_{33}$ is selected by the word line $X_3$ and the bit line $Y_3$. At the initial stage of the write period, the write enable signal $\overline{WE}$ is in H level, and the control signals $\phi_W$ and $\phi_R$ are in L and H levels, respectively. Also, the data output lines D and $\overline{D}$ of the data input circuit 7 are in H level. Therefore, the data output circuit 8 is prohibited to provide an output signal, and the self diagnosis circuit 15 does not store the signal on the data lines D and $\overline{D}$.

Next, when the write enable signal $\overline{WE}$ goes to L level during $t_{wp}$ period, the data input signal $D_{in}$ (which is for instance assumed to be H level) is applied to the data input circuit 7, and then, the data lines D and $\overline{D}$ go to H and L level, respectively, and then, the signal on the data lines D and $\overline{D}$ is stored in the memory cell $M_{33}$ (see FIGS. 3(b), 3(c), 3(d), 3(e), 3(g)).

Simultaneously, the MOS transistors $Q_1$ and $Q_2$ in the self diagnosis circuit 15 become ON state, and the signal on the data lines D and $\overline{D}$ is stored in the memory circuit 21. Then, the MOS transistors $Q_7$ and $Q_8$ go to OFF and ON states, respectively, and the MOS transistors $Q_9$ and $Q_{10}$ go to ON and OFF states, respectively.

Next, when the write enable signal $\overline{WE}$ changes to H level again in the latter portion ($t_{WR}$) of the write period $t_{wc}$, the content of the memory cell $M_{33}$ is read out to the data lines D and $\overline{D}$, which are at L and H level, because of error of the memory cell $M_{33}$. Then, the MOS transistors $Q_7$ and $Q_8$ in the self diagnosis circuit 15 go to OFF and ON states, respectively, the MOS transistors $Q_9$ and $Q_{10}$ go to ON and ON states, respectively, and the H level of control signal P which indicates an error is output (see FIG. 3(h)).

The row register 16 and the column register 17 take the H level information on the selected row $X_3$ and the selected column $Y_3$ to the temporary memory circuit 20, according to the H level of control signal P, and the level Q goes to H level. Thus, those registers 16 and 17 store the address of the defective cell.

Next, in the read period $t_{RC}$, when the defective memory cell $M_{33}$ is selected, the L and H signal are applied to the data lines D and $\overline{D}$, respectively. It should be noted that said L and H level signals are in error. Since the row register 16 and the column register 17 provide L level of output signal $X_s$ and L level of output signal $Y_s$, respectively since the selected address coincides with the address stored in those registers 16 and 17, the NOR circuit 18 changes the output signal S to H level. Therefore, the output signal provided by the data output circuit 8 is, then, inverted by the output inverter circuit 19, and the inverted output signal is applied to the data output terminal $D_{out}$.

Accordingly, it should be appreciated that the present semiconductor memory device can correct an error of a defective memory cell.

As described above in detail, according to the present invention, the fact that a defective memory cell is selected and that information is stored in that defective memory cell are memorized, and when that defective memory cell is selected in a read phase, the read out signal of the defective cell is inverted. Thus, the error is automatically corrected.

Accordingly, no spare row word line, nor spare column bit line, is necessary, and of course, a fuse line (P and Q in FIG. 1) is not necessary. Further, since a laser beam is not used for cutting a fuse line in the present invention, the chip surface of the memory is not polluted by spatters.

Since the present invention corrects an error of a defective cell merely by an internal circuit, the structure of the memory system can be simplified, and the producing cost of the memory device can be decreased.

Further, according to the present invention, the yield rate is improved considerably since a partially defective memory chip can be used positively.

The present invention is useful in particular for a single bit defect, a single line defect and/or a single column defect. It should be noted that the yield rate is improved when said three defects are corrected by the present invention.

In the above embodiment of FIG. 2, a single set of self diagnosis circuit 15, and the registers 16 and 17 are provided. In that case, defective memory cells on a single row or column line in the memory array can be effectively corrected. The temporary memory circuit 20 is designed to be equal to the total number of row and column lines.

Although the embodiments discribe a static semiconductor memory device, the present invention can be applied to a large capacity of dynamic semiconductor memory device and/or a memory means in a microprocessor.

From the foregoing, it will now be apparent that a new and improved semiconductor memory device has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. A semiconductor memory device comprising:
   a memory array having word and bit lines arranged as a matrix and a plurality of memory cells connected between said bit and word lines;
   a data line;
   a switching circuit for selectively connecting said data line with the bit lines of the memory array;
   a data input circuit coupled to the data line for delivering information to the data line; and
   a data output circuit coupled to the data line to read out information from a selected memory cell in the memory array to an output terminal through the data line; wherein the improvement comprises;
   a self-diagnosis circuit coupled to the data line for storing during a writing period the information on said data line which is also stored in a selected memory cell of said memory array and for then comparing the information stored in said self-diagnosis circuit with that from said selected memory cell, said self-diagnosis circuit delivering an error signal when the two pieces of information are different from each other;

a first register circuit coupled to said bit lines of said memory array for storing, in response to said error signal, an indication of the particular bit line of the memory cell which resulted in said error signal, and for subsequently delivering a first register output signal upon the reading of a memory cell on said particular bit line;

a second register circuit coupled to said word lines of said memory array for storing, in response to said error signal, an indication of the particular word line of the memory cell which resulted in said error signal, and for subsequently delivering a second register output signal upon the reading of a memory cell on said particular word line;

a logic circuit for producing a control signal upon receipt of both the first and second register output signals; and an output inverter circuit for inverting information fed from said data output circuit to said output terminal in response to said control signal from said logic circuit.

2. A device according to claim 1, wherein said self-diagnosis circuit compares the information from a selected memory cell with the information stored in said self-diagnosis circuit during the latter part of a writing period.

3. A device according to claim 1, wherein said self-diagnosis circuit comprises an associative memory circuit.

4. A device according to claim 1, wherein said first register comprises a plurality of temporary memory circuits, and said second register comprises a plurality of temporary memory circuits.

5. A device according to claim 2, wherein said first register comprises a plurality of temporary memory circuits, and said second register comprises a plurality of temporary memory circuits.

6. A device according to claim 1, wherein said logic circuit comprises a NOR circuit.

* * * * *